US006039812A

United States Patent [19]

Ellison et al.

[11] Patent Number: 6,039,812

[45] Date of Patent: Mar. 21, 2000

[54] DEVICE FOR EPITAXIALLY GROWING OBJECTS AND METHOD FOR SUCH A GROWTH

[75] Inventors: Alex Ellison, Linkoping; Olle Kordina, Sturefors; Chun-Yuan Gu, Vasteras; Christer Hallin, Linkoping; Erik Janzen, Borensberg; Marko Tuominen, Linkoping, all of Sweden

[73] Assignees: ABB Research Ltd., Zurich, Switzerland; Okmetic Ltd., Espo, Finland

[21] Appl. No.: 08/959,191

[22] Filed: Oct. 28, 1997

Related U.S. Application Data

[63] Continuation-in-part of application No. 08/735,402, Oct. 21, 1996, abandoned.

[51] Int. Cl.[7] ............................ C23C 16/00; C30B 29/36

[52] U.S. Cl. ............................ 118/725; 118/715; 117/951

[58] Field of Search .................................... 118/715, 725; 117/951

[56] References Cited

U.S. PATENT DOCUMENTS

| | | | |
|---|---|---|---|
| 4,147,571 | 4/1979 | Stringfellow et al. | 148/175 |
| 4,508,054 | 4/1985 | Baumberger et al. | 118/718 |
| 4,533,410 | 8/1985 | Ogura et al. | 148/175 |
| 4,748,135 | 5/1988 | Frijlink | 437/102 |
| 4,751,192 | 6/1988 | Hirooka et al. | 437/4 |
| 4,798,166 | 1/1989 | Hirooka et al. | 118/719 |
| 4,866,005 | 9/1989 | Davis et al. | 437/100 |
| 4,989,541 | 2/1991 | Mikoshiba et al. | 118/723 |
| 5,000,113 | 3/1991 | Wang et al. | 118/723 E |
| 5,256,205 | 10/1993 | Schmitt | 118/723 |
| 5,322,568 | 6/1994 | Ishihara et al. | 118/715 |
| 5,343,938 | 9/1994 | Schmidt | 165/80.2 |
| 5,704,985 | 1/1998 | Kordina et al. | 118/725 |

FOREIGN PATENT DOCUMENTS

| | | | |
|---|---|---|---|
| 63-260124 | 10/1988 | Japan | 118/715 |
| 1-223724 | 9/1989 | Japan | 118/715 |

OTHER PUBLICATIONS

Kordina Et Al., High Temperature Chemical Vapor Deposition of SiC, Technical Digest of International Conference on SiC and Related Materials–ICSCRM–95, Kyoto, Japan, 1995.

Kordina Et Al., High Temperature Chemical Vapor Deposition of SiC, Appl. Phys. Lett. 69(10), Sep. 2, 1996.

*Primary Examiner*—Jeffrie R Lund

*Attorney, Agent, or Firm*—Pollock, Vande Sande & Amernick

[57] ABSTRACT

A device for epitaxially growing objects of for instance SiC by Chemical Vapor Deposition on a substrate has a first conduit (24) arranged to conduct substantially only a carrier gas to a room (18) receiving the substrate and a second conduit (25) received in the first conduit, having a smaller cross-section than the first conduit and extending in the longitudinal direction of the first conduit with a circumferential space separating it from inner walls of the first conduit. The second conduit is adapted to conduct substantially the entire flow of reactive gases and it ends as seen in the direction of the flows, and emerges into the first conduit at a distance from said room.

17 Claims, 4 Drawing Sheets

18

7

10

33

32

35

41

25

36

26

34

DEVICE FOR EPITAXIALLY GROWING OBJECTS AND METHOD FOR SUCH A GROWTH

This application is a continuation-in-part of U.S. patent application Ser. No. 08/735,402, now abandoned, filed Oct. 21, 1996.

TECHNICAL FIELD OF THE INVENTION AND PRIOR ART

The present invention relates to a device for epitaxially growing objects of one of a) SiC, b) a Group III-nitride and c) alloys thereof by Chemical Vapour Deposition on a substrate comprising a susceptor having circumferential walls surrounding a room for receiving the substrate, means for feeding a flow of at least a carrier gas and reactive gases needed for the growth into the susceptor towards the substrate and means for heating the circumferential walls and by that the substrate and the reactive gases above a temperature level from which the reactive gases start to decompose into substances depositing on the substrate for the growth of an object. The feeding means comprise a conduit emerging into the room. The invention also relates to a method for epitaxially growing such objects.

Accordingly, the invention is applicable to the growth of SiC, Group III-nitrides and alloys thereof, but the common problem when such objects are to be grown of a high crystalline quality and at a reasonable growth rate from the commercial point of view will now by way of a non-limitative example be further explained for SiC.

When SiC single crystals are grown at such a reasonable growth rate the temperature at which the substrate and the reactive gases, e.g. silane and propane, are heated has to be rather high, and preferably is the so called High Temperature Chemical Vapour Deposition (HTCVD) technique, which is described in the U.S. Pat. No. 5,704,985 (corresponding to the Swedish patent application 9502288-5) by the present applicant, used. Such high temperatures do however cause a premature decomposition of the reactive gases, especially silane in the conduit near the inlet thereof in the room in a device defined above and described in for example the U.S. Pat. No. 5,704,985. Such a premature decomposition causes a plugging of the conduit after some time, so that the growth has to be interrupted earlier than desired. Furthermore, there will be irregularities in the flow of the reactive gases towards the substrate when the cross-section of the free passage of the conduit is gradually reduced during the growth.

SUMMARY OF THE INVENTION

The object of the present invention is to provide a solution to the problem discussed above by providing a device and method making it possible to epitaxially grow objects of SiC, a Group III-nitride or alloys thereof at a high growth rate while still obtaining a high crystalline quality of the object grown and be able to carry out the growth until an object of the size desired has been grown.

This object is in accordance with the invention obtained by providing a device defined in the introduction with feeding means further comprising an additional second conduit received in the first-mentioned first conduit, having a smaller cross-section than the first conduit and extending in the longitudinal direction of the first conduit with a circumferential space separating it from inner walls of the first conduit. The said feeding means is adapted to make the first conduit conduct substantially only a carrier gas and the second conduit conduct substantially the entire flow of reactive gases, and the second conduit ends, as seen in the direction of the flows, and emerges into the first conduit at a distance from the room. Thus, the reactive gases are separated from the main flow of the carrier gas (the second conduit may also conduct smaller amounts of carrier gas for increasing the velocity of the flow therein). Due to the fact that the second conduit ends at a distance from the room it will not get so hot that there will be any risk of decomposition of reactive gases therein, and plugging of the second conduit. Furthermore, the flow of reactive gases emerging from said second conduit will, thanks to said circumferential space, be surrounded in the critical plugging zone by the carrier gas flow in the conduit and it will tend to continue moving straight on as if the second conduit would still be there without any substantial intermixing with the carrier gas flow. Accordingly, the carrier gas flow will at least partially thermally insulate the flow of reactive gases from the hot wall of the first conduit, so that the temperature will be lower in that part of the first conduit where the reactive gases flow. This fact will counteract premature decomposition of the reactive gases in the first conduit before the inlet thereof into the room, and if such decomposition would occur, the decomposed gases have a long way to diffuse through the carrier gas flow for reaching the inner wall of the first conduit and will therefore only to a small extent reach the wall, so that plugging of the portion of the first conduit closest to the room is avoided or will in any case result after a much longer time than in prior art devices. Another advantage of this device is that the reactive gases, especially silane in the case of growth of SiC, is not wasted by a considerable decomposition and depositing before entering the susceptor so that a better economy is also achieved in that sense.

According a preferred embodiment of the invention the first conduit has a cross-section being enlarged in the region where the second conduit emerges into the first one and decreasing from this region in the direction of the room. This is a very advantageous feature making it possible to remarkably prolong the growth time until a possible plugging of the inlet even if the object is grown at a high growth rate. As mentioned, a fraction of the reactive gases will decompose in the first conduit before reaching the room and tend to deposit on the inner walls thereof. Such depositions occur substantially only within a determined temperature range of the reactive gases, which corresponds to the temperature these gases reach nearly directly downstream of their entrance into the first conduit, accordingly in the region, and at the distance downstream thereof they have again exceeded this critical temperature range, so that a deposition ring will be formed in the first conduit in this region. By making the cross-section enlarged in this region and reducing it from this region in the direction of the room, the outer carrier gas flow conducted along the walls of the first conduit will in this region be accelerated as it passes through a portion of this conduit having a decreasing cross-section, so that this flow, when reaching the critical region where parasitic depositions may occur, will force species of the reactive gases back to the center. The net amount of species from the decomposed reactive gases reaching the heated walls of the first conduit will be decreased. Furthermore, the heating of the inner walls of the first conduit in this region is decreased by a radiation screening effect and by a net decrease of conduction heat transfer per unit volume, since the cross-section of the first conduit will be smaller closer to the room than in the region. Besides that, it will also take a longer time for the first conduit to be plugged simply for the reason that the cross-section thereof is enlarged in the region.

According to another preferred embodiment of the invention the first conduit has inner walls converging from the region. It has been found that this is an appropriate way of obtaining the decreasing cross-section. The walls may converge in any desired way such as linearly, exponentially or according to another function.

According to another preferred embodiment of the invention the first conduit has a cross-section decreasing from the region in the direction of the room to a first location upstream of the room and from the location to the room a substantially constant cross-section, which will reduce the heating of the inner walls of the first conduit upstream of the location by a radiation screening effect and by a net decrease of conduction heat transfer per unit volume.

According to another preferred embodiment of the invention the cross-section of the first conduit increases from a second location downstream of the region and to the room, so that the opening into the room will be shaped as a diffuser and the reactive gases will be spread in a way that under certain circumstances will be desired.

According to another preferred embodiment of the invention it comprises elements adapted to cool the inner walls of a first wall portion of the first conduit next to the region upstream thereof, and that wall portions of the first conduit downstream of the first wall portion are made of a material with a thermal conductivity utilizing heat transfer from the heated susceptor for obtaining a temperature gradient along walls of the first conduit in the region which is as steep as possible. This means that the temperature gradient in the first conduit will be very steep in the region, which means that the reactive gases are violently heated when emerging from the inner second conduit and will by that be accelerated by free convection and pass the area critical for parasitic depositions as fast as possible. Furthermore, the presence of a steep temperature gradient allows to define the critical area as just downstream thereof, so that depositions will occur in a wide cross-section part of the first conduit, where it is harmless, and not in the end of the conduit part with decreasing cross-section, where it would lead to a rapid blocking.

According to another preferred embodiment of the invention the first and second conduits are concentrically arranged with respect to each other at least close to said room. Such a mutual arrangement of the two conduits is advantageous, since the shortest distance between the second conduit and inner walls of the first conduit will then be a maximum and by that the advantage of the invention mentioned above will then be as great as possible.

According to another preferred embodiment of the invention the conduits have a substantially vertical extension, a substantially vertical wall of the room is adapted to carry the substrate, and the room has a gas outlet arranged in the ceiling thereof substantially opposite to the inlet. By forming such a so-called chimney reactor configuration a good quality growth is obtained. This configuration of the device also makes it possible to arrange a plurality of substrates for growth of object thereon on the substantially vertical walls of the room, so that the growth capacity is multiplied, and higher growth rates may also be obtained due to a geometry suitable for higher temperatures with low carrier gas flows.

According to another preferred embodiment of the invention the device is adapted for growth of objects of SiC, and the heater is arranged to heat the reactive gases so that the temperature thereof rises above 500° C. after entering the first conduit but before entering the room. This is advantageous, since the reactive gases, especially silane, when it is used, will start to decompose at 500° C., and it should be avoided that this takes place in the second conduit. However, it is impossible to avoid that this happens before the reactive gases reach the room, since otherwise the temperature in the room would be much too low for obtaining a high growth rate.

According to another preferred embodiment constituting a further development of the embodiment last mentioned, the heater is arranged to heat the reactive gases so that the temperature thereof rises above 500° C. in the portion of the first conduit with a decreasing cross-section in the most upstream part of this portion. This is very preferred, since the deposition ring formed primarily by Si species will by this be located where the cross-section is very wide and a possible blocking of the conduit will take a very long time.

A method according to the invention and preferred embodiments is also provided. In a preferred embodiment the carrier gas is fed in the first conduit with substantially the same velocity as that of the flow of reactive gases in the second conduit, and it has turned out that the choice of substantially the same velocity of both flows will lead to an optimum result with a minimum of intermixing of the two flows beyond the end of the second conduit, so that the reactive gases will move on in the prolongation of the second conduit surrounded by the carrier gas flow substantially without any contents of reactive gases.

Further preferred features and advantages of the device and method according to the invention will appear from the following description.

BRIEF DESCRIPTION OF THE DRAWINGS

With reference to the appended drawings below follows a specific description of preferred embodiments of the invention cited as examples.

In the drawings.

DETAILED DESCRIPTION OF A PREFERRED EMBODIMENT OF THE INVENTION

Figure 1:
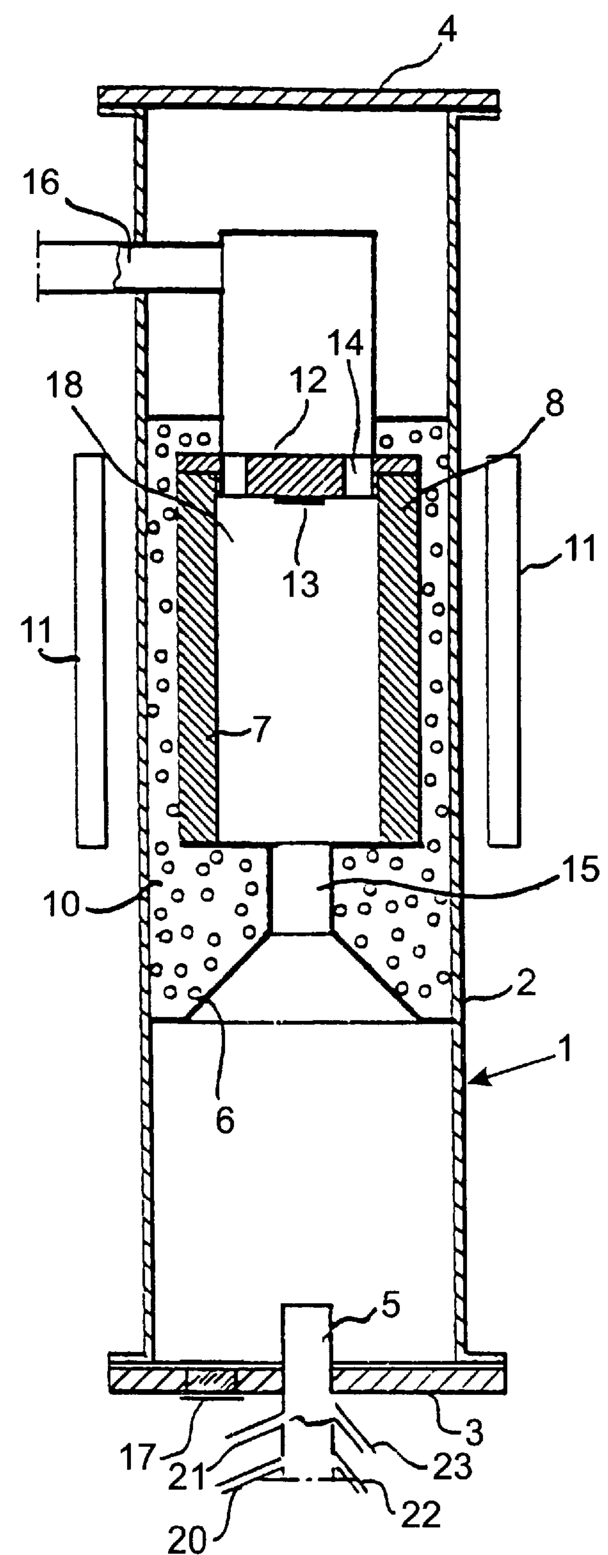
FIG. 1 is a longitudinal cross-section view of a prior art device of the type described in the U.S. Pat. No. 5,704,985 for the growth of objects by Chemical Vapour Deposition.

FIG. 1 shows schematically a device of the type described in the U.S. Pat. No. 5,704,985, but it will also be described here, since the device according to the invention may have the same principle construction as that device and only differ therefrom by the particular characteristics defined in the present invention. This device is suited for epitaxially growing SiC by Chemical Vapour Deposition on a SiC substrate.

The device is shown in a simplified manner, and it is obvious that the device in question also comprises other elements, such as pumps, but conventional equipment having nothing to do with the invention has been omitted for the sake of clarity and concentration on the invention.

This device comprises a casing 1 constituted by a tube 2 of quartz extending substantially vertically and two opposite end flanges 3 and 4. The end flange 4 is preferably removable so as to provide access to the interior of the tube 2. A conduit 5 for supplying a flow of a carrier gas and reactive gases, preferably silane and propane, for the growth to the substrate is introduced through the lower end flange 3. The conduit 5 is connected to separate conduits 20–23 leading to sources for different gases for the growth, such as silane and propane, and the carrier gas, and these conduits are provided with flow regulating means for regulating the content of each component in the gas flow in the conduit 5. The conduits 20–23 are in FIG. 1 for the sake of clarity illustrated as emerging into the conduit 5 close to the casing 1, but in practice they will probably be at a greater distance therefrom.

Furthermore, the device comprises a funnel 6 for concentrating the gas flow from the conduit 5 into a susceptor 7. The susceptor 7 shown in FIG. 1 is adapted for epitaxially growing layers of SiC. The susceptor is substantially cylindrical with circumferential walls 8 of a substantially uniform thickness. The walls are made of graphite, but they are internally coated by a layer of SiC or alternately covered by a cylindrical plate made of SiC. The space surrounding the susceptor is enclosed and filled by graphite foam 10 for thermal insulation to protect the surrounding quartz tube 2. Rf-field radiating means 11 in form of a Rf-coil surrounds the tube 2 along the longitudinal extension of the susceptor 7. This heater 11 is arranged to radiate a Rf-field uniformly heating the walls 8 of the susceptor and thereby the gas mixture introduced into the susceptor.

The susceptor 7 comprises a lid 12 of the same material as the rest of the susceptor, on the lower side of which a SiC substrate 13 is arranged and which may be removed from the rest of the susceptor so as to remove the substrate after a layer has been grown thereon. The lid 12 is provided with peripheral gas outlet holes 14, so that a preferably laminar gas flow will enter the susceptor room 18 through a lower inlet conduit 15 and flow close to the substrate and leave the susceptor through the upper outlets 14 and then the device through a conduit 16 is optionally connected to a pump not shown.

The temperature inside the susceptor 7 may be checked pyrometrically through looking into the susceptor 7 through a window indicated at 17.

The heater 11 heats susceptor walls 8 and in turn, the susceptor room 18, the substrate 13 and the gases introduced into the susceptor room through the conduit 15, whereby the reactive gases decompose and deposit on the substrate for the growth. However, when high growth rates are desired it is necessary to raise the temperature inside the susceptor to a high level, such as for instance above 2000° C., and it may not be avoided that the temperature in the conduit 15 will be so high that reactive gases, especially silane, will be decomposed in this conduit and deposited on the inner wall of that conduit. This results in the cross-section of the conduit being reduced and plugging of the conduit will occur a long time before a growth run would otherwise be terminated, so that the growth run has to be interrupted too early.

Figure 2:
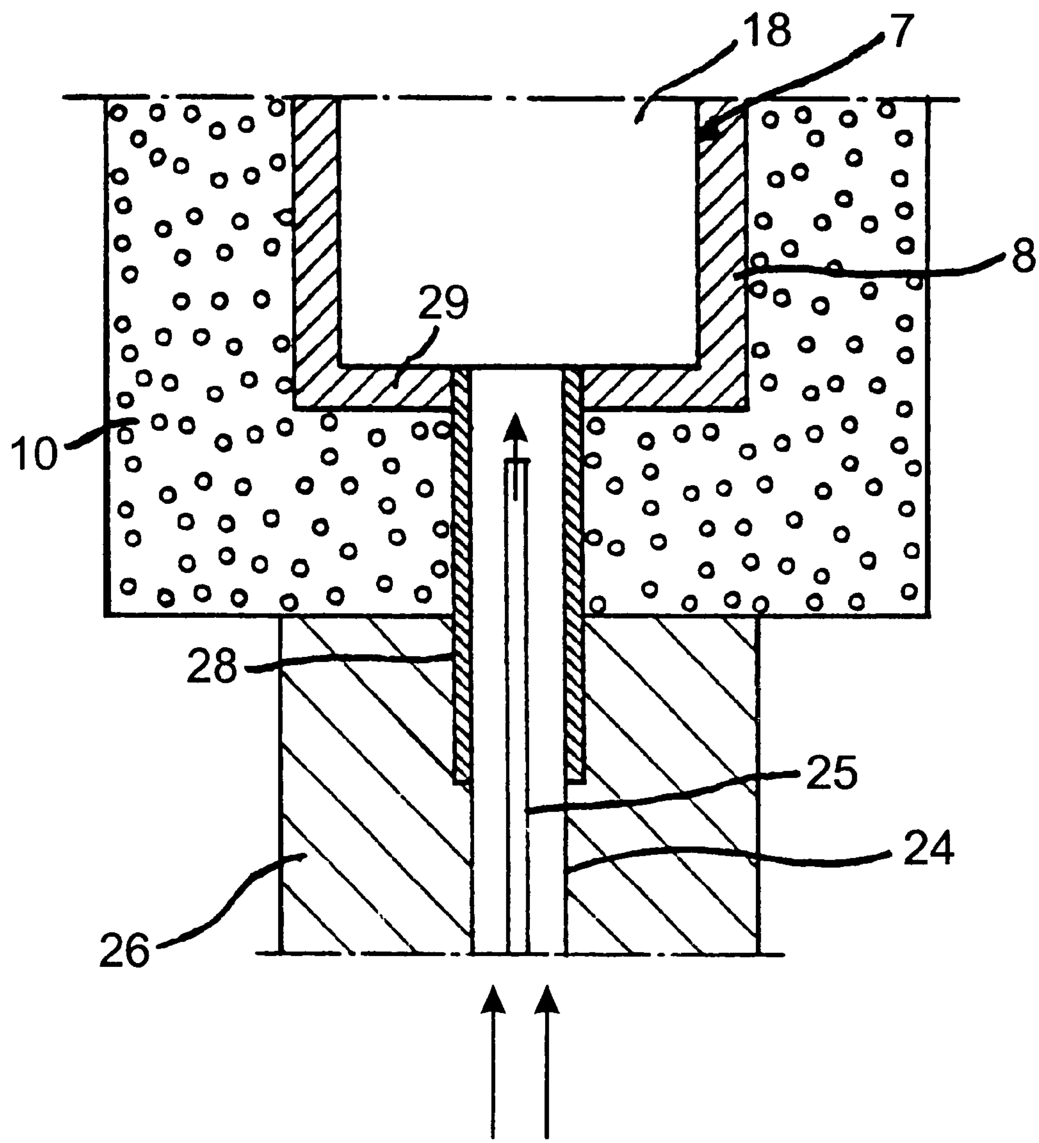
FIG. 2 is an enlarged view of the gas inlet part of the susceptor in a device of the type shown in FIG. 1 according to a first preferred embodiment of the invention.

FIG. 2 illustrates how the inlet side of such a device may be modified according to a preferred embodiment of the invention so as to solve the problem just mentioned. In this device a first conduit 24 emerges into the room 18 of the susceptor 7 and is adapted to conduct substantially only a carrier gas to the susceptor room 18. The definition of carrier gas is a gas not actively participating in the growth, i. e. not having components which are grown into the object of the substrate. This carrier gas may preferably be Argon, Helium or a blend thereof. The device further comprises a second conduit 25 received in the first conduit, having a smaller cross-section than the first conduit and extending in the longitudinal direction of the first conduit with a circumferential space separating it from inner walls of the first conduit.

Furthermore, the second conduit is concentrically arranged with respect to the first conduit. Both conduits are in this case rigid tubes, and the first conduit 24 is made for instance of stainless steel with regard to the portion 26 extending to the outer wall of the susceptor, and this porion 26 is water-cooled. The inner walls of the first conduit 24 closest to the room 18 are made of SiC, dense graphite or pyrolitic graphite by arranging a tube 28 there. The second, inner conduit 25 is preferably made of SiC or other high-temperature resistant materials as Tantalum or Tungsten in order to avoid any contamination of the reactive gases by undesirable impurities.

The second conduit 25 is adapted to conduct substantially the entire flow of reactive gases, but some carrier gas may also be introduced together with these reactive gases, which may be for the silicon precursor, silane or chlorosilanes, and for the carbon precursor, propane, methane or ethylene when SiC is grown, to give them a high velocity depending on the conditions. Doping source gases may also be conducted in the second conduit. Furthermore, and this is an essential feature of the present invention, the second conduit ends, as seen in the direction of the flows, and emerges into the first conduit at a distance from the room 18. This distance is chosen so that the reactive gases will not reach such a high temperature inside the second conduit that they will decompose therein. The required distance will accordingly depend upon the temperature that is chosen inside the susceptor room 18 for the growth, the carrier gas flow and which carrier gas is chosen, since the carrier gas may act as a thermal insulator between the walls of the first conduit and the second conduit. More exactly, the second conduit ends comparatively close to the room, here at a short distance from the bottom 29 thereof, but this will be enough for avoiding decomposition of reactive gases in the second conduit.

Accordingly, the reactive gases will emerge into the first conduit without being decomposed and travel in the central part of the first conduit at a distance from the walls thereof, and the carrier gas flow will move in the space between the flow of reactive gases and the inner walls of the first conduit so as if the second conduit 25 would actually continue until the room 18 of the susceptor. It is preferred to control the velocities of the carrier gas flow and the flow in the second conduit so that they are substantially the same for obtaining as little intermixing therebetween as possible. The surrounding carrier gas flow will act as a thermal insulator for the central flow of reactive gases and retard the temperature raise thereof, so that the reactive gases are preferably not decomposed before entering the room 18 of the susceptor. Should this occur after all, the components resulting from a decomposition of reactive gases will only to a small extent reach the wall of the first conduit, since they have to diffuse through the surrounding carrier gas flow all the way to the inner wall of the first conduit for depositing thereon.

Figure 3:
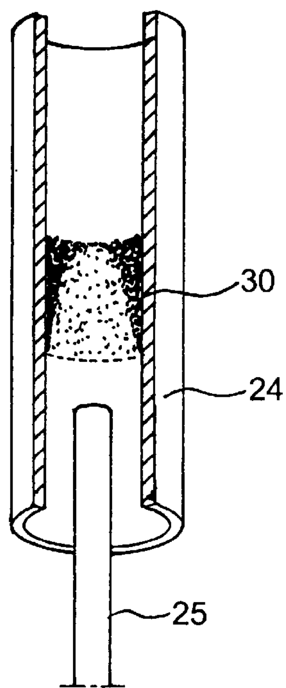
FIG. 3 is a view being enlarged with respect to FIG. 2 of the region where the second conduit emerges into the first one of the gas inlet part of FIG. 2.

It has, however, been found that some of the species resulting from the decomposition of the reactive gases will reach and deposit on the inner wall of the first conduit, and it has moreover been found that such deposition occurs only within a determined temperature range of the reactive gases, namely in the case of growing SiC approximately from 500 to 800° C. Below 500° C. $SiH_4$ will not be decomposed and above 800° C. the acceleration of the gases and homogeneous nucleation of $SiH_4$ into solid polymers/crystallites, which are no longer able to react with the inlet walls, prevent deposition. Should a high growth rate be obtained, high temperatures in the susceptor is needed therefor, namely at least above 1500° C., but most preferred 2000–2500° C., so that it will be impossible to avoid the reactive gases from entering within the temperature range inside the first conduit, and in the embodiment shown in FIG. 2 this Qill result in a deposition ring 30 as illustrated in FIG. 3. This deposition ring will be located a few millimetres above the end of the second conduit 25. This deposition, which in the case of $SiH_4$ gas is due to deposition of polycrystalline Si, eventually leads to a blocking of the first conduit there, especially if very high growth rates and high temperatures are chosen, which is a necessity for producing SiC crystals in a commercially viable way.

Figure 4:
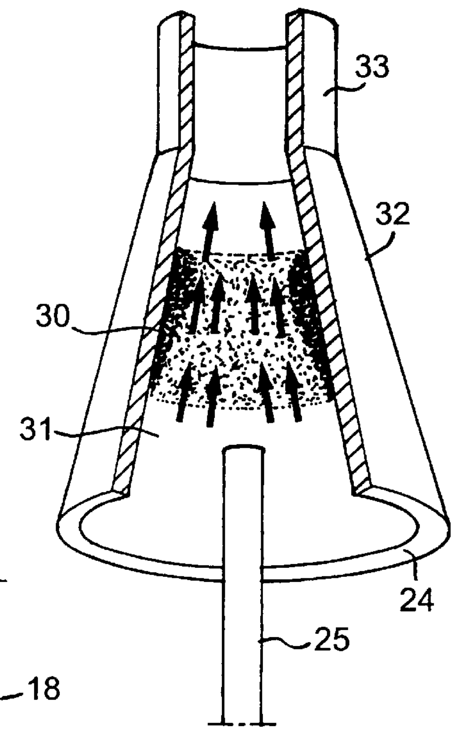
FIG. 4 is a view corresponding to FIG. 3 of the gas inlet part of a device according to a second preferred embodiment of the invention.

It is schematically illustrated in FIG. 4 how the first conduit may be modified in the region 31 where the second conduit emerges into the first one for solving this problem. More exactly, the cross-section of the first conduit is enlarged in this region and the inner walls thereof converge in the downstream direction, so that a portion 32 of the first conduit is substantially cone-shaped. This portion is followed by a substantially cylindrical portion 33. This means that the deposition ring 30 will be located in a part of the first conduit where the cross-section is large and by that the deposition rate is therefore harmless. The decreasing cross-section of the first conduit in this region will also result in an acceleration of the carrier gas flow, so that this will force the reactive species back to the center of the first conduit and by that spreading and thus reducing the building of the deposition ring. Downstream of the deposition ring the temperature will be above the range and there will due to mechanisms such as acceleration of the gases, lower Si supersaturation and homogeneous nucleation of Si related species in the gas-phase into solid polymers/particles, which are no longer able to react with the inlet walls, be no parasitic deposition.

Figure 5:
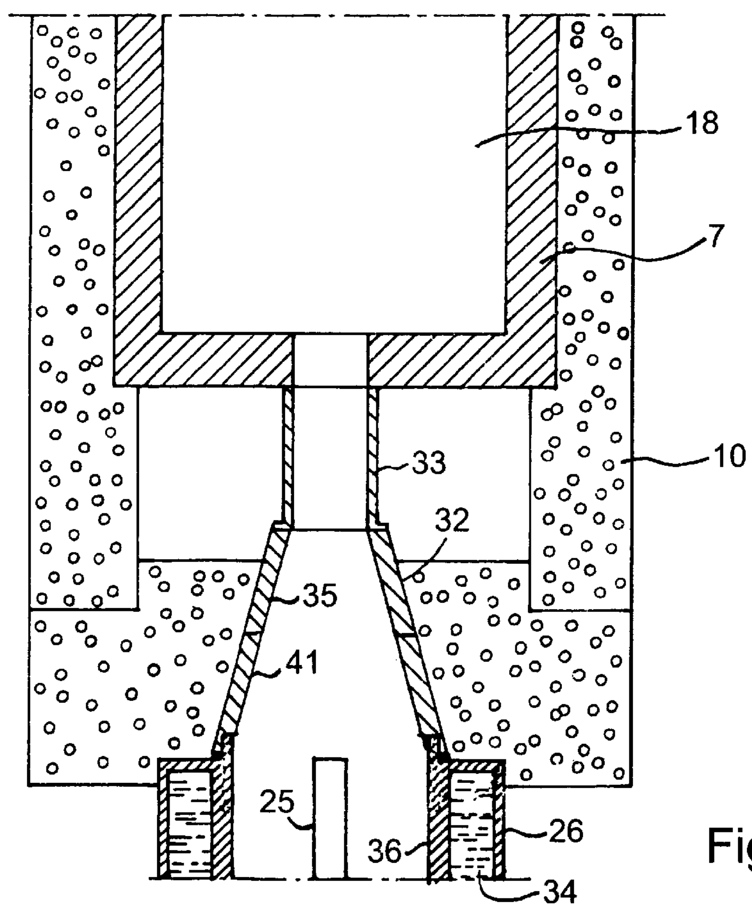
FIG. 5 is a sectioned view of a device according to a third preferred embodiment of the invention.

A device according to another embodiment of the invention is illustrated in FIG. 5. The same references as in the previous figures are used for corresponding elements. It is illustrated how an inlet flange 26 forming the first conduit is provided with water-cooling elements 34 for cooling the first conduit, so that the temperature of the carrier gas flow therein and by that the temperature of the reactive gases in the second conduit is kept at an acceptable level. Furthermore, either the thickness of the converging portion 32 of the first conduit may be varied or the portion 32 may be made in two graphite parts 35, 41 with differing thermal conductivity, so that the temperature gradient from the watercooled stainless steel portion 36 to the graphite of the portion 35 (primarily heated by conduction and radiation from the graphite susceptor 7 placed further above) will be very steep, so that the reactive gases are violently heated when emerging from the second conduit, so that they are accelerated by free convection and pass the critical temperature zone (500–800° C. for $SiH_4$) as fast as possible. Furthermore, the presence of a steep temperature gradient makes it possible to define this critical zone as being graphite located just thereabove, so that it is ensured that inevitable depositions occur in the wide cross-section part of the converging inlet where it is harmless.

Figure 6:
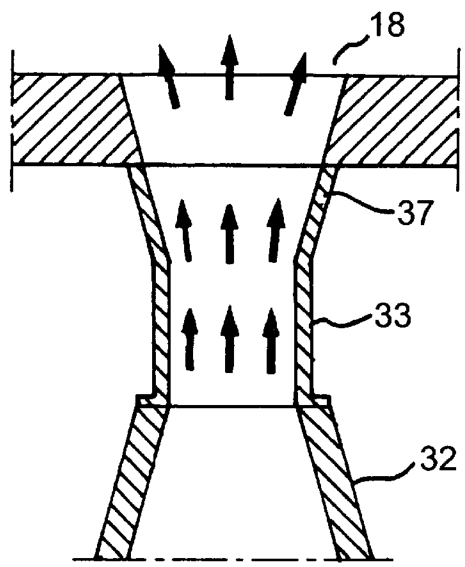
FIG. 6 is a view corresponding to FIG. 3 and 4 of the gas inlet part of the susceptor in a device of a fourth preferred embodiment of the invention.
Figure 7:
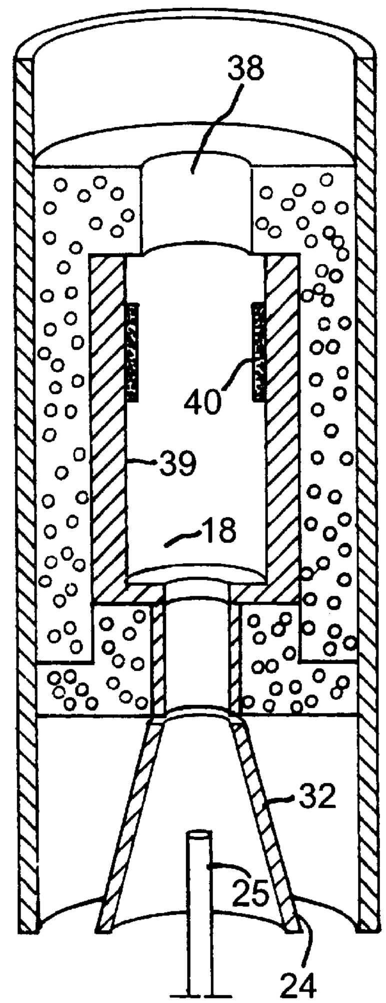
FIG. 7 is a simplified view of a device according to a fifth preferred embodiment of the invention.

FIG. 6 illustrates a further embodiment with the first conduit close to the opening into the susceptor room 18, and a portion 37 of the first conduit close to the susceptor room diverges towards the room, so that a diffuser-like inlet is created and by that the gases entering the susceptor room will be spread towards the circumferential walls thereof, which may be suitable, in particular in a device of the type shown in FIG. 7.

The device according to FIG. 7 is a so-called chimney reactor, which has an outlet 38 located centrally opposite to the inlet, and vertical walls 39 of the susceptor arranged to carry substrates 40 for epitaxial growth of SiC thereon. The cross-section of the room may in this case be rectangular. It is in this way possible to increase the capacity of the susceptor and grow more than one object at a time, and higher growth rates may be obtained due to a geometry suitable for increased temperatures and with low carrier gas flows.

The invention is of course not in any way restricted to the preferred embodiment of the device and method described above, but several possible modifications thereof would be apparent for a person skilled in the art without departing from the basic idea of the invention.

As already mentioned, the invention is also applicable to the growth of a Group III-nitride or an alloy of Group III-nitrides or an alloy of SiC and one or more Group III-nitrides, for which the corresponding positive result may be expected. As an example, it may be mentioned that Tri-Methyl-Gallium may be used as a precursor gas for the growth of GaN.

The definition "objects" in the claims is made for including the epitaxial growth of all types of crystals, such as layers of different thicknesses as well as thick boules.

All definitions concerning the material of course also include inevitable impurities as well as intentional doping.

Although it has been indicated in the figures that the flow of gases to the substrate is substantially vertical, it is within the scope of the invention to arrange the device with an arbitrary extension direction, such as for instance horizontal.

What is claimed is:

1. A device for epitaxially growing objects on a substrate by chemical vapor deposition, the device comprising:

a susceptor having circumferential walls surrounding a room which receives said substrate;

a feeder for providing a flow of at least a carrier gas and a reactive gas into said susceptor and including:

a first conduit emerging into said room; and a second conduit received in said first conduit, said second conduit having a smaller cross-section than said first conduit and extending in a longitudinal direction of said first conduit with a circumferential space separating said second conduit from inner walls of said first conduit, said first conduit conducting substantially only a carrier gas and said second conduit conducting only substantially reactive gases, said second conduit ending in said first conduit at a distance from said room, said first conduit having an enlarged cross-section in a region where said second conduit ends which decreases in the direction of said room;

a heater for heating said circumferential walls and thereby heating said substrate and said reactive gasses above a temperature level from which said reactive gases decompose on said substrate.

2. A device according to claim 1, wherein said inner walls of said first conduit converge from said region.

3. A device according to claim 2, wherein said first conduit is substantially cone-shaped from said region and in the direction of said room.

4. A device according to claim 1, said cross-section of said first conduit decreases from said region in the direction of the room to a first location upstream of said room and from said first location to the room said cross-section is substantially constant.

5. A device according to claim 1, wherein said the cross-section of the first conduit increases from a second location downstream of said region to said room.

6. A device according to claim 1, further comprising means adapted to cool the inner walls of a first wall portion of said first conduit next to said region upstream thereof, and that wall portions of the first conduit downstream of the first wall portion are made of a material with a thermal conductivity utilizing heat transfer from the heated susceptor for obtaining a temperature gradient along walls of the first conduit in said region being as steep as possible.

7. A device according to claim 6, wherein said first conduit comprises at least two succeeding parts with differing thermal conductivities.

8. A device according to claim 1, wherein said first and second conduits are concentrically arranged with respect to each other.

9. A device according to claim 1, wherein said second conduit is made of SiC, Tantalum or Tungsten.

10. A device according to claim 1, wherein said conduits have a substantially vertical extension, a substantially vertical wall of said room is adapted to carry said substrate, and said room has a gas outlet arranged in the ceiling thereof substantially opposite to the inlet.

11. A device according to claim 10, wherein the walls of the room are adapted to carry a plurality of substrates for growth of objects thereon.

12. A device according to claim 1, being adapted for growth of objects of SiC.

13. A device according to claim 12, wherein said heater is arranged to heat said circumferential walls, and by that the substrate and said reactive gases at a temperature above 1500° C.

14. A device according to claim 13, wherein said heater is arranged to heat said circumferential walls, and by that the substrate and said reactive gases at a temperature above 2000° C.

15. A device according to claim 12, wherein said heater is arranged to heat the reactive gases so that the temperature thereof rises above 500° C. after entering the first conduit, but before entering the room.

16. A device according to claim 15, wherein said heater is arranged to heat the reactive gases so that the temperature thereof rises above 500° C. in the portion of the first conduit with a decreasing cross-section in the most upstream part of this portion.

17. A device according to claim 12, wherein said feeder is arranged to feed silane or chlorosilanes as a silicon precursor and propane, methane or ethylene as a carbon precursor in concentrated or diluted form.

* * * * *